United States Patent
Zhao et al.

(10) Patent No.: US 10,338,420 B2
(45) Date of Patent: Jul. 2, 2019

(54) FINGERPRINT IDENTIFICATION COMPONENT AND DISPLAY APPARATUS

(71) Applicant: BOE TECHNOLOGY GROUP CO., LTD., Beijing (CN)

(72) Inventors: Lijun Zhao, Beijing (CN); Haisheng Wang, Beijing (CN); Chun-Wei Wu, Beijing (CN); Yingming Liu, Beijing (CN); Rui Xu, Beijing (CN); Changfeng Li, Beijing (CN); Yanan Jia, Beijing (CN); Yuzhen Guo, Beijing (CN); Yunke Qin, Beijing (CN); Pinchao Gu, Beijing (CN); Yanling Han, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 16 days.

(21) Appl. No.: 15/718,340

(22) Filed: Sep. 28, 2017

(65) Prior Publication Data

US 2018/0239183 A1 Aug. 23, 2018

(30) Foreign Application Priority Data

Feb. 23, 2017 (CN) .......................... 2017 1 0100288

(51) Int. Cl.
*G06F 3/041* (2006.01)
*G09G 3/36* (2006.01)
(Continued)

(52) U.S. Cl.
CPC ........ *G02F 1/13306* (2013.01); *G02F 1/1368* (2013.01); *G02F 1/13338* (2013.01);
(Continued)

(58) Field of Classification Search
CPC ........... G02F 1/13306; G02F 1/133514; G02F 1/136286; G02F 1/1368; G02F 1/133526;
(Continued)

(56) References Cited

U.S. PATENT DOCUMENTS

2011/0069047 A1* 3/2011 Koyama ............... G02F 1/1345
345/204
2014/0036168 A1* 2/2014 Ludwig ................ G06F 3/0412
349/12

(Continued)

*Primary Examiner* — Nelson M Rosario
(74) *Attorney, Agent, or Firm* — Calfee, Halter & Griswold LLP (57) ABSTRACT

The present disclosure relates to a fingerprint identification component and a display apparatus, which belongs to the field of fingerprint identification. The fingerprint identification component includes: a thin film transistor TFT array and a photovoltaic device array, the TFT array including a plurality of TFTs, the photovoltaic device array including a plurality of photovoltaic devices, the plurality of TFTs in the TFT array and the plurality of optoelectronic devices in the photovoltaic device array correspond to each other one by one, and each TFT in the TFT array is electrically connected to a corresponding photovoltaic device; and SG lines of any adjacent two TFTs in the TFT array do not coincide with each other, the SG line is a line where a center of a source electrode and a center of a drain electrode of the any one TFT are located.

20 Claims, 5 Drawing Sheets

(51) Int. Cl.
    *G02F 1/133*    (2006.01)
    *G02F 1/1368*   (2006.01)
    *G02F 1/1335*   (2006.01)
    *G02F 1/1362*   (2006.01)
    *H01L 27/32*    (2006.01)
    *G02F 1/1333*   (2006.01)
    *G02B 19/00*    (2006.01)

(52) U.S. Cl.
    CPC .. *G02F 1/133514* (2013.01); *G02F 1/136286* (2013.01); *H01L 27/3227* (2013.01); *H01L 27/3262* (2013.01); *G02B 19/0009* (2013.01); *G02B 19/0042* (2013.01); *G02F 1/133526* (2013.01); *G02F 2001/13324* (2013.01)

(58) Field of Classification Search
    CPC ....... G02F 2001/13324; H01L 27/3227; H01L 27/3262; G02B 19/0009; G02B 19/0042
    See application file for complete search history.

(56) References Cited

U.S. PATENT DOCUMENTS

2017/0279948 A1\* 9/2017 Hong ................. G06K 9/00013
2018/0130844 A1\* 5/2018 Choo ................. H01L 27/1255

\* cited by examiner

FINGERPRINT IDENTIFICATION COMPONENT AND DISPLAY APPARATUS

CROSS-REFERENCES TO RELATED APPLICATIONS

This application claims priority to Chinese Patent Application No. 201710100288.3 filed in China on Feb. 23, 2017, the entire contents of which are hereby incorporated by reference.

TECHNICAL FIELD

The present disclosure relates to the field of fingerprint identification, and more particularly, to a fingerprint identification component and a display apparatus.

BACKGROUND

At present, a variety of electronic devices possess a fingerprint identification function. More and more people are accustomed to performing various operations, such as unlocking a screen and confirming payment, through the fingerprint identification function.

It should be noted that, information disclosed in the above background portion is provided only for better understanding of the background of the present disclosure, and thus it may contain information that does not form the prior art known by those ordinary skilled in the art.

SUMMARY

The embodiments of the present disclosure provide a fingerprint identification component and a display apparatus. The technical solutions are as follows.

According to a first aspect of the present disclosure, there is provided a fingerprint identification component, including:

a thin film transistor TFT array and a photovoltaic device array, the TFT array including a plurality of TFTs, the photovoltaic device array including a plurality of photovoltaic devices, the plurality of TFTs in the TFT array and the plurality of optoelectronic devices in the photovoltaic device array correspond to each other one by one, and each TFT in the TFT array is electrically connected to a corresponding photovoltaic device; and SG lines of any adjacent two TFTs in the TFT array do not coincide with each other, the SG line of any one TFT in the TFT array being a line where a center of a source electrode of the any one TFT and a center of a drain electrode of the any one TFT are located.

According to a second aspect of the present disclosure, there is provided a display apparatus, including a display panel and the fingerprint identification component described above.

It is to be understood that both the foregoing general description and the following detailed description are exemplary and explanatory only and are not restrictive of the present disclosure, as claimed.

This section provides a summary of various implementations or examples of the technology described in the disclosure, and is not a comprehensive disclosure of the full scope or all features of the disclosed technology.

BRIEF DESCRIPTION OF THE DRAWINGS

In order to more clearly illustrate the technical solutions of embodiments of the present disclosure, the drawings used to describe the embodiments will be briefly introduced below. It will be apparent that the drawings in the following description are merely some embodiments of the present disclosure. Other drawings may be obtained by those skilled in the art based on these drawings without paying for creative labor.

FIG. 2-1 is a schematic structural view of a fingerprint identification component according to an embodiment of the present disclosure;

FIG. 2-2 is a top view of a TFT array in the fingerprint identification component as shown in FIG. 2-1;

FIG. 3-1 is another schematic structural view of a fingerprint identification component according to an embodiment of the present disclosure;

FIG. 3-2 is a top view of a TFT array in the fingerprint identification component as shown in FIG. 3-1;

FIG. 3-3 is a cross-sectional view at a section line x in the TFT array as shown in FIG. 3-2;

FIG. 3-4 is another schematic structural view of a TFT array in a fingerprint identification component according to an embodiment of the present disclosure;

FIG. 3-5 is another schematic structural view of a fingerprint identification component according to an embodiment of the present disclosure;

FIG. 4-1 is a schematic structural view of a display apparatus according to an embodiment of the present disclosure; and FIG. 4-2 is another schematic structural view of a display apparatus according to an embodiment of the present disclosure.

In the above drawings, reference numerals may have following meanings: TFT1, TFT2, TFT3 and TFT4-TFT5 in a TFT array; 21—TFT array; 22—optoelectronic device array; s1 and s2—source electrodes; d1 and d2—drain electrodes; c1—center of s1; c2—center of d1; c3—center of s2; c4—center of d2; g, g1 and g2—gate electrodes; p1—SG line of TFT3; p2—SG line of TFT4; 221—photovoltaic device; 221a—upper electrode; 221b—lower electrode; 221c—optoelectronic material; Da—data line; sa1 and sa2—active layers; 23—inter-layer dielectric; 24—gate insulating layer; 25—other film layers below; 26—flat layer, 27—light shielding layer, u—arrangement direction of any column of TFTs in the TFT array; p3—SG line of TFT5; 28—lens array; 30—display panel; 31—color film substrate; 32—liquid crystal layer; and 33—array substrate.

Throughout the above drawings, specific embodiments of the present disclosure have been shown, which will be described in more detail later. These drawings and textual description are not intended to limit the conception scope of the present disclosure by any manner, but rather to teach those skilled in the art the concepts of the present disclosure by reference to specific embodiments.

DETAILED DESCRIPTION

The implementation of the present disclosure will be described in more detail with reference to the accompanying drawings, in order that the objects, technical solutions and advantages of the present disclosure will become more apparent.

Figure 1:
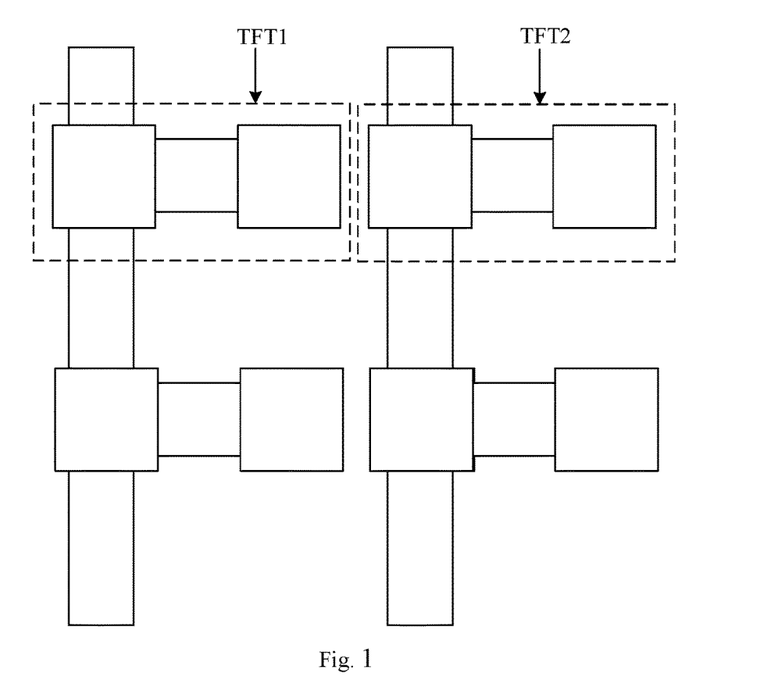
FIG. 1 is a schematic structural view of a fingerprint identification component according to a comparative example of the present disclosure.

FIG. 1 is a schematic structural view of a fingerprint identification component according to a comparative example of the present disclosure. Referring to FIG. 1, a fingerprint identification component includes a thin film transistor (TFT) array and a photovoltaic device array, wherein the TFT array include a plurality of TFTs and the photovoltaic device array includes a plurality of photovoltaic devices. The TFTs in the TFT array and the optoelectronic devices in the photovoltaic device array correspond to each other one by one, and each TFT in the TFT array is electrically connected to a corresponding photovoltaic device. When the fingerprint identification is performed, ambient light or a light ray emitted from an external light source is irradiated onto a finger, the finger reflects the light ray to the photovoltaic device array. The optoelectronic device in the optoelectronic device array converts the received light ray into a current and transmits the same to a TFT corresponding to the photovoltaic device. Since a valley (a recessed portion of the finger) and a ridge (a protruding portion of the finger) of a fingerprint on the finger cause that the light ray irradiated onto a finger has different reflectivity, currents transferred from different optoelectronic devices in the optoelectronic device array to respective corresponding TFTs will be different. Thus, fingerprint information may be acquired according to the current received by different TFTs in the TFT array. A density of the photovoltaic devices in the photovoltaic device array may be increased, in order to acquire more detailed fingerprint information.

When the density of the photovoltaic devices in the above fingerprint identification component is increased, the density of the TFTs in the TFT array will be increased accordingly. As shown in FIG. 1, when a distance between adjacent TFT1 and TFT2 is too small, a short circuit may occur between the two TFTs.

Figure 21:
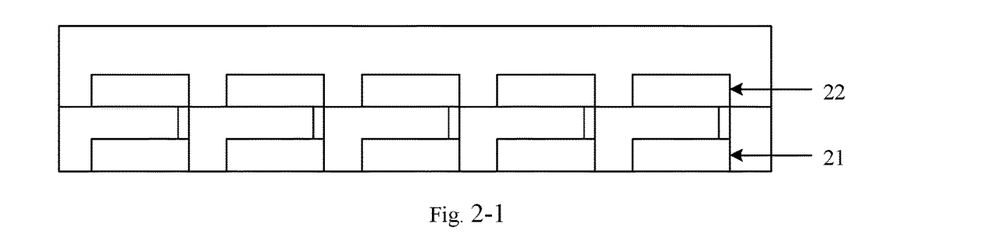

FIG. 2-1 is a schematic structural view of a fingerprint identification component according to an embodiment of the present disclosure. The fingerprint identification component may include:

a TFT array 21 and a photovoltaic device array 22, the TFT array 21 including a plurality of TFTs, the photovoltaic device array 22 including a plurality of photovoltaic devices, the plurality of TFTs in the TFT array 21 and the plurality of optoelectronic devices in the photovoltaic device array 22 correspond to each other one by one, and each TFT in the TFT array 21 is electrically connected to a corresponding photovoltaic device.

Figure 22:
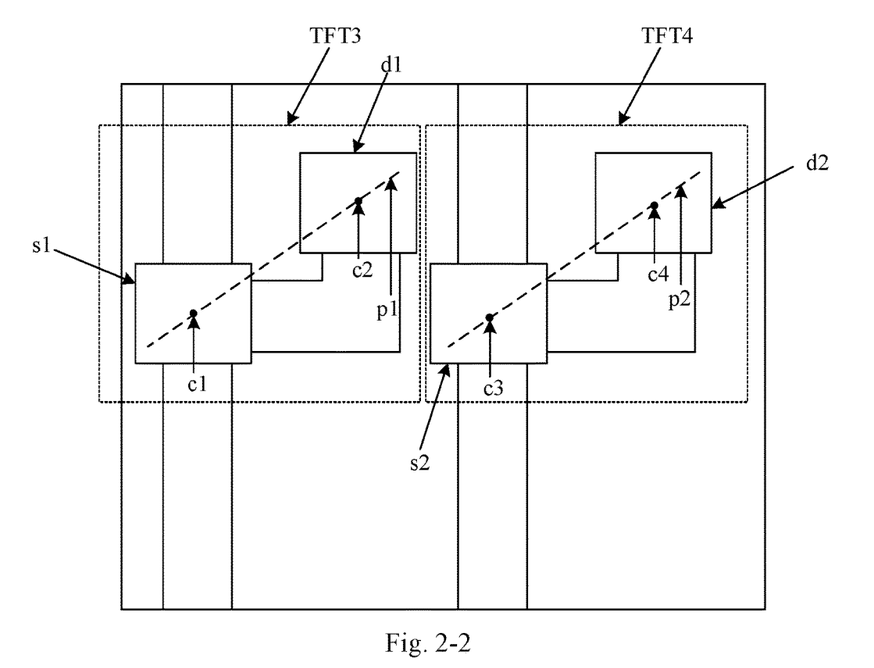

SG lines of any adjacent two TFTs in the TFT array 21 do not coincide with each other, the SG line of any one TFT in the TFT array 21 being a line where a center of a source electrode of the any one TFT and a center of a drain electrode of the any one TFT are located. In other words, the SG line of a TFT refers to a line passing through the center of the source electrode and the center of the drain electrode of the TFT. The center of the source electrode may refer to a geometric center of the source electrode, and the center of the drain electrode may refer to a geometric center of the drain electrode. As shown in FIG. 2-2, it is a top view of a TFT array 21 as shown in FIG. 2-1. In FIG. 2-2, TFT3 and TFT4 are adjacent two TFTs, a line p1 where a center c1 of a source electrode s1 and a center c2 of a drain electrode d1 of the TFT3 are located is a SG line of the TFT3, and a line p2 where a center c3 of a source electrode s2 and a center c4 of a drain electrode d2 of the TFT4 are located is a SG line of the TFT4. The SG line p1 and the SG line p2 do not coincide with each other.

In view of above, in the fingerprint identification component provided by the embodiment of the present disclosure, the source and drain electrodes of every adjacent two TFTs in the fingerprint identification component are staggered, which increases the distance between lines of the adjacent two TFTs, thus solving a problem that a short circuit may occur when the distance between adjacent two TFTs is too small, and achieving an effect of avoiding the short circuit between the TFTs.

Figure 31:
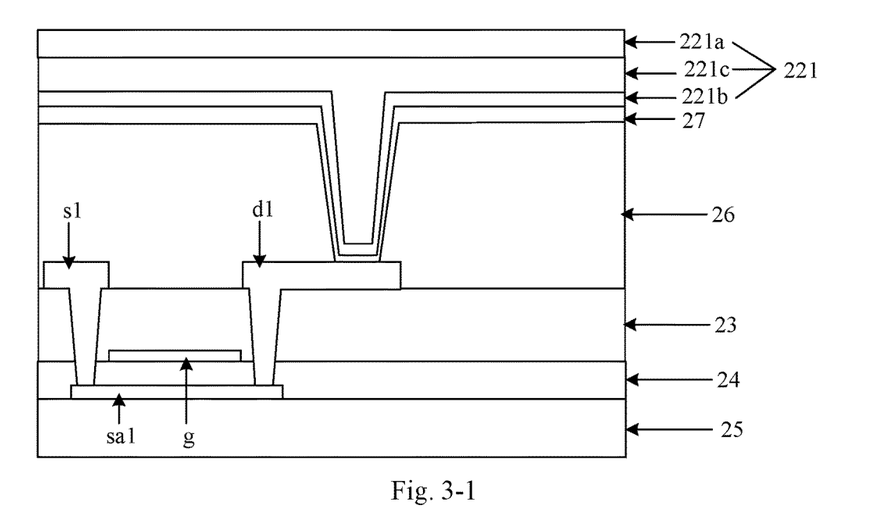

Further, FIG. 3-1 is referred to. FIG. 3-1 is another schematic structural view of a fingerprint identification component according to an embodiment of the present disclosure. The fingerprint identification component in FIG. 3-1 adds preferred parts on the basis of the fingerprint identification component as shown in FIG. 2-1, such that the fingerprint identification components provided by the embodiment of the present disclosure has better performance.

Any one photovoltaic device 221 in the photovoltaic device array includes two electrodes (including an upper electrode 221a and a lower electrode 221b) and a photoelectric material 221c provided between the two electrodes. A material of the lower electrode 221b may include indium tin oxide (ITO). The optoelectronic material 221c may be an organic optoelectronic material. Sa1 is an active layer, 23 is an inter-layer dielectric (ILD), 24 is a gate insulating layer, 25 is other film layers below, such as a mask layer of gate electrode and a substrate plate or the like. S1 is a source electrode which may be connected to a data line, d1 is a drain electrode, 26 is a flat layer, 27 is a light shielding layer which may be made of a conductive metal material and serve to prevent a light ray from irradiating onto the active layer sa1 to influence the active layer sa1. It is to be noted that, the upper electrode 221a may be an entire layer structure laid on the entire photovoltaic device array, while the lower electrode 221b may be one-to-one correspondence to the TFTs in the TFT array. In the embodiment of the present disclosure, the lower electrode 221b, the photovoltaic material and the upper electrode thereon (an upper part in FIG. 3-1) may be taken as a photovoltaic device.

Figure 32:
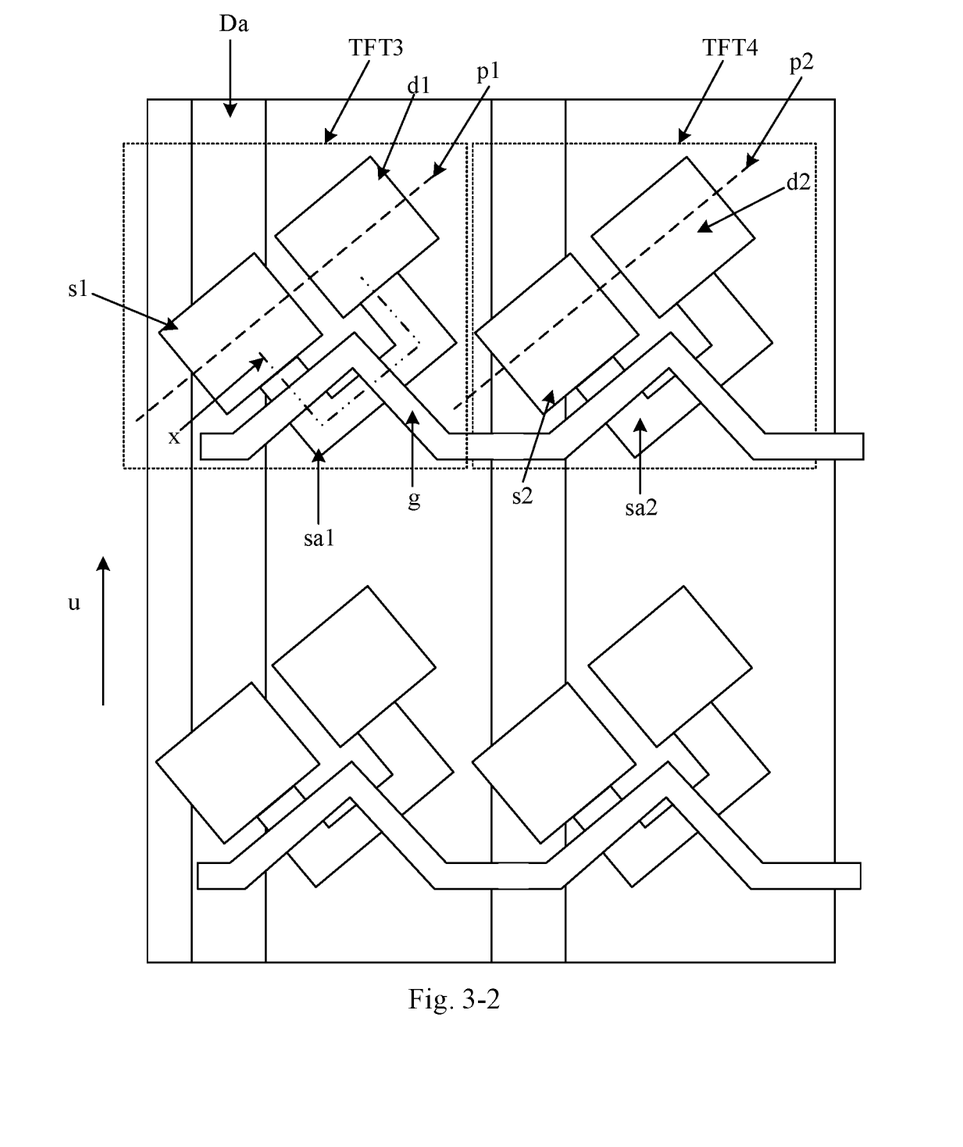

As shown in FIG. 3-2, it is a top view of a TFT array in the fingerprint identification component shown in FIG. 3-1. In the TFT array of the fingerprint identification component shown in FIG. 3-2, any one TFT is a multi-gate TFT. In a conventional TFT, there is only one gate electrode to control the current to pass through or be interrupted between the source electrode and the drain electrode. However, a gate electrode of the multi-gate TFT may have two, three or more gates, which improves the ability of the TFT to control the current, reduces power consumption and reduces the mutual interference of the currents.

In FIG. 3-2, the TFT3 and TFT4 are multi-gate TFTs, g is a gate electrode, sa1 is an active layer of TFT3, sa2 is an active layer of TFT4, and a data line Da may be connected to a source electrode s1 of the TFT3 (the data line Da and the source electrode s1 are located at different layers and may be connected through a via hole). The source and drain electrodes (the source electrode and the drain electrode) of each TFT in the TFT array are typically located in the same layer, such that the source and drain electrodes of each TFT may be formed in one patterning process. In a comparison embodiment, since the SG lines of all TFTs in each row of TFTs coincide with each other, a short circuit may occur when a density of TFTs in the row direction is too high causing that the source and drain distance of adjacent two TFTs is too small, a distance between adjacent two TFTs in a row direction in the TFT array will be limited by the distance between the source and drain electrodes of the two TFTs. While in the fingerprint identification component provided by the present embodiment, the SG lines of every adjacent two TFTs do not coincide with each other, i.e., the source and drain electrodes of every adjacent two TFTs are staggered. Even if the density of each row of TFTs is high, the distance between the source and drain electrodes of adjacent two TFTs will not be too small, so that the density of each row of TFTs may be higher than that of the related art, and the identification accuracy of the fingerprint identification component is high. In the comparison embodiment, the density of each row of TFTs is low, and light rays reflected by the plurality of valleys or ridges of a fingerprint on the finger of a user may be reflected into the same optoelectronic device, which makes the identification accuracy of the fingerprint identification component low. The meanings of other reference numerals in FIG. 3-2 may be referred to FIG. 2-2, which will not be repeated herein.

Figure 33:
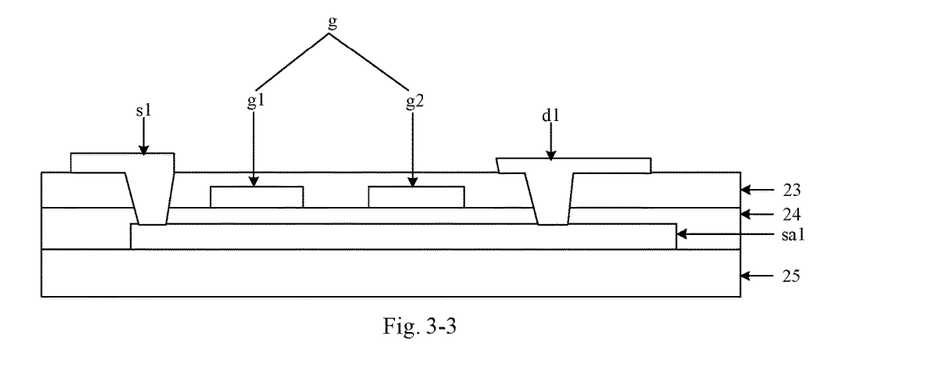

As shown in FIG. 3-3, it is a cross-sectional view at a section line x in the TFT array as shown in FIG. 3-2. In FIG. 3-3, the gate electrode g may include g1 and g2, sa1 is an active layer, 23 is an inter-layer dielectric, 24 is a gate insulating layer, 25 is other film layers below, such as a mask layer of gate electrode and a substrate plate or the like. The source electrode s1 may be connected to a data line. The drain electrode d1 may be connected to a photovoltaic device for transmitting electrical signals between the photovoltaic device and the TFT. The structure of the multi-gate TFT may also be referred to the related art, which will not be repeated herein. In addition, the gate electrodes g shown in FIGS. 3-2 and 3-3 include two gates, and the gate electrode g may also include more gates, which is not limited by the embodiment of the present disclosure.

In FIG. 3-2, the plurality of TFTs in the TFT array 11 are arranged in rows and columns, i.e., the TFT array 11 may include n rows and m columns of TFTs, n and m being positive integers greater than one. In addition, the SG lines of any row of TFTs in the TFT array 11 are parallel to each other.

Optionally, the SG lines of any row of TFTs in the TFT array is at a preset angle from an arrangement direction u of any column of TFTs in the TFT array, the preset angle being greater than 0 degree and smaller than 90 degrees. Optionally, the preset angle is 45 degrees.

Figure 34:
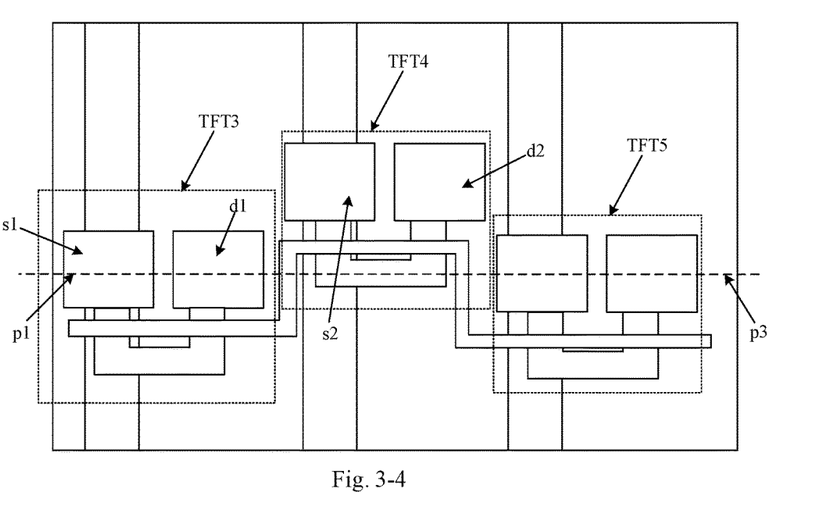

As shown in FIGS. 3-4, it is another schematic structural view of a TFT array in a fingerprint identification component according to an embodiment of the present disclosure. In FIG. 3-4, in any row of TFT in the TFT array, the SG lines of two TFTs spaced by one TFT coincide with each other. In other words, the SG lines from every other TFT in any row of TFT in the TFT array coincide with each other. In FIG. 3-4, a SG line p1 of a TFT3 and a SG line p3 of a TFT5 coincide with each other, in which the TFT3 and the TFT5 is spaced by a TFT 4. The meanings of other reference numerals in FIG. 3-4 may be referred to FIG. 3-1, which will not be repeated herein.

The fingerprint identification component provided by the embodiment of the present disclosure may include at least one of the TFT array shown in FIG. 3-2 and the TFT array shown in FIG. 3-4.

Figure 35:
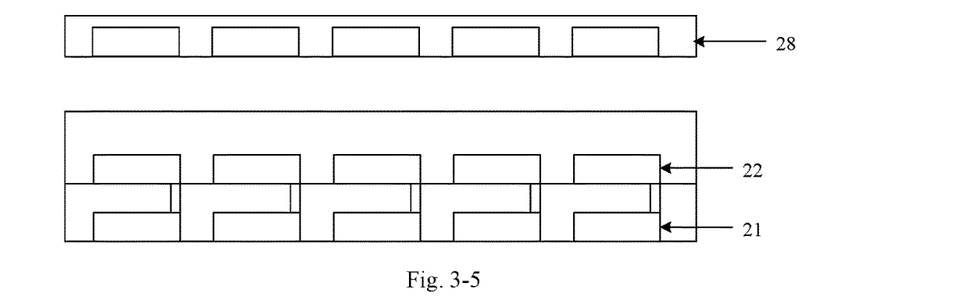

As shown in FIG. 3-5, it is another schematic structural view of a fingerprint identification component according to an embodiment of the present disclosure. The fingerprint identification component further includes a lens array 28. The lens array 28 includes a plurality of lenses arranged in an array. The lens array 28 is provided on the photovoltaic device array and configured to change a direction of a light ray directed toward the photovoltaic device array. Optionally, the lens array 28 may converge light rays directed to the photovoltaic device array, to improve the identification accuracy and sensitivity of the fingerprint identification component. Alternatively, the lens array 28 may diverge light rays directed to the photovoltaic device array, to prevent the light ray from being directed to the optoelectronic device array when the fingerprint identification is not performed.

It should be noted that, in the fingerprint identification component provided by the embodiment of the present disclosure, the source and drain electrodes of any row of TFTs in the TFT array may be staggered in other manners, which is not limited by the embodiment of the present disclosure.

In view of above, in the fingerprint identification component provided by the embodiment of the present disclosure, the source and drain electrodes of every adjacent two TFTs in the fingerprint identification component are staggered, which increases the distance between lines of the adjacent two TFTs, thus solving a problem that a short circuit may occur when the distance between adjacent two TFTs is too small, and achieving an effect of avoiding the short circuit between the TFTs.

FIG. 4-1 is a schematic structural view of a display apparatus according to an embodiment of the present disclosure. The display apparatus may include a display panel and any one of the fingerprint identification components shown in FIGS. 2-1, 3-1, 3-4 and 3-5.

Figure 41:
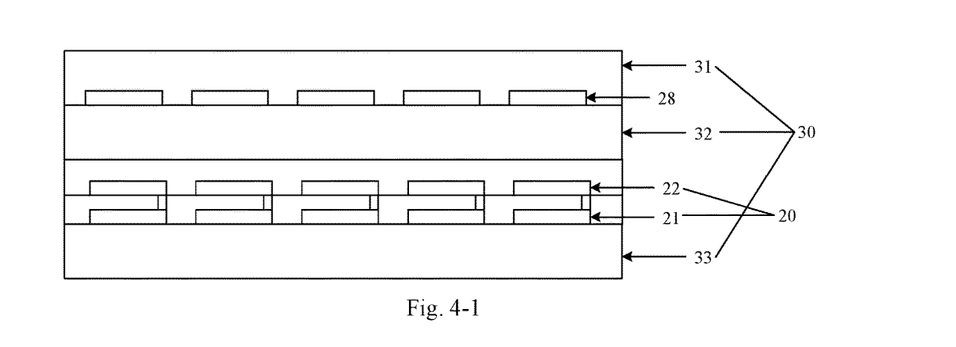

The fingerprint identification component 20 includes a TFT array 21 and a photovoltaic device array 22. The TFT array 21 and the optoelectronic device array 22 are provided in the display panel 30.

Optionally, the display panel 30 may be a liquid crystal display (LCD) panel. The display panel 30 includes a color film substrate 31, a liquid crystal layer 32 and an array substrate 33. A TFT array for displaying, which is not the TFT array 21 in the fingerprint identification component 20, may be provided on the array substrate 33. The liquid crystal layer 32 is provided between the color film substrate 31 and the array substrate 33. The TFT array 21 and the optoelectronic device array 22 are provided on the array substrate 33. In addition, the TFT array 21 and the photovoltaic device array 22 may also be provided on the color film substrate, and the present embodiment is not limited thereto.

Optionally, the fingerprint identification component further includes a lens array 28, and the lens array is provided on the color film substrate 31.

Figure 42:
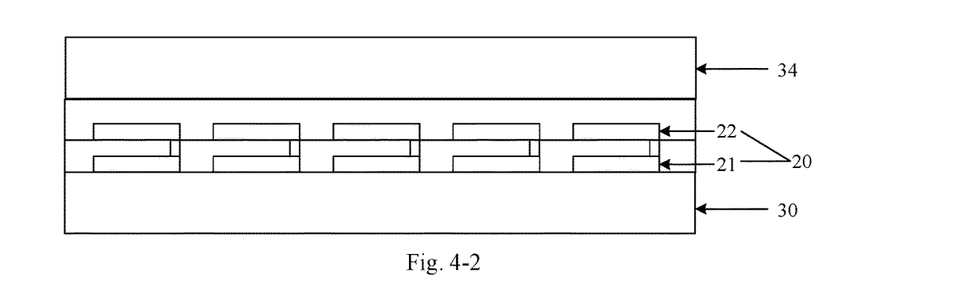

As shown in FIG. 4-2, it is another schematic structural view of a display apparatus according to an embodiment of the present disclosure. In this display apparatus, the display panel 30 is an organic light-emitting diode (OLED) display panel. The OLED display panel is a self-luminous display panel. The TFT array 21 and the photovoltaic device array 22 may be provided on the display panel 30. A transparent cover plate 34 may be further provided on the TFT array 21 and the photovoltaic device array 22. The transparent cover plate 34 serves to protect the TFT array 21 and the photovoltaic device array 22.

It should be noted that, in the display apparatus provided by the embodiment of the present disclosure, the TFT array 21 and the TFTs and the photovoltaic devices included in the photovoltaic device array 22 may be provided in a non-display region of the display panel, or partly provided in a non-display region of the display panel, to avoid or reduce the influence on the display of the display panel.

It should be further noted that, in the display apparatus provided by the embodiment of the present disclosure, the fingerprint identification component 20 may be further provided at a light exiting side of the display panel 30. That is, the fingerprint identification component 20 is provided outside the display panel 30.

In view of above, in the display apparatus provided by the embodiment of the present disclosure, the source and drain electrodes of every adjacent two TFTs in the fingerprint identification component are staggered, which increases the distance between lines of the adjacent two TFTs, thus solving a problem that a short circuit may occur when the distance between adjacent two TFTs is too small, and achieving an effect of avoiding the short circuit between the TFTs.

The terms "at least one of A and B" in the present disclosure is merely an association relationship that describes an association object, indicating that there may be three relationships. For example, "at least one of A and B" may represent three cases where only A exists, A and B coexist and only B exists. Similarly, "at least one of A, B, and C" may indicate that there may be seven relationships, which may represent seven cases where only A exists, only B exists, only C exists, A and B coexist, A and C coexist, C and B coexist, and A, B and C coexist. Similarly, "at least one of A, B, C and D" may indicate that there may be fifteen relationships, which may represent fifteen cases where only A exists, only B exists, only C exists, only D exists, A and B coexist, A and C coexist, A and D coexist, C and B coexist, D and B coexist, C and D coexist, A, B and C coexist, A, B and D coexist, A, C and D coexist, B, C and D coexist, and A, B, C and D coexist.

The beneficial effects of the technical solution provided by the embodiments of the present disclosure are:

by staggering the source and drain electrodes of every adjacent two TFTs in the fingerprint identification component, the distance between lines of the adjacent two TFTs is increased, thus solving a problem that a short circuit may occur when the distance between adjacent two TFTs is too small, and achieving an effect of avoiding the short circuit between the TFTs.

The foregoing is merely preferred embodiments of the present disclosure and is not intended to limit the present disclosure. Any modification, equivalent substitution, improvement, and the like within the spirit and principle of the present disclosure is intended to be encompassed by the protection scope of the present disclosure.

What is claimed is:

1. A fingerprint identification component, comprising:
a thin film transistor TFT array and a photovoltaic device array, the TFT array comprising a plurality of TFTs, the photovoltaic device array comprising a plurality of photovoltaic devices, the plurality of TFTs in the TFT array and the plurality of optoelectronic devices in the photovoltaic device array correspond to each other, and each TFT in the TFT array is electrically connected to a corresponding photovoltaic device; and
in any adjacent two TFTs in the TFT array, a virtual line connecting a center of a source electrode and a center of a drain electrode of a first TFT do not coincide with a virtual line connecting a center of a source electrode and a center of a drain electrode of a second TFT.

2. The fingerprint identification component according to claim 1, wherein the plurality of TFTs in the TFT array are arranged in rows and columns, and
the virtual lines of any row of TFTs in the TFT array are parallel to each other.

3. The fingerprint identification component according to claim 2, wherein the virtual lines of any row of TFTs in the TFT array is at a preset angle from an arrangement direction of any column of TFTs in the TFT array, the preset angle being greater than 0 degree and smaller than 90 degrees.

4. The fingerprint identification component according to claim 3, wherein the preset angle is 45 degrees.

5. The fingerprint identification component according to claim 2, wherein the virtual lines of two TFTs spaced by one TFT among the any row of TFTs in the TFT array coincide with each other.

6. The fingerprint identification component according to claim 1, wherein any one of the photovoltaic devices comprises two electrodes and a photoelectric material provided between the two electrodes.

7. The fingerprint identification component according to claim 1, wherein any one of the TFTs is a multi-gate TFT.

8. The fingerprint identification component according to claim 1 further comprising a lens array,
wherein the lens array is provided on the photovoltaic device array and configured to change a direction of a light ray directed toward the photovoltaic device array.

9. A display apparatus, comprising:
a display panel; and
a fingerprint identification component, comprising:
a thin film transistor TFT array and a photovoltaic device array, the TFT array comprising a plurality of TFTs, the photovoltaic device array comprising a plurality of photovoltaic devices, the plurality of TFTs in the TFT array and the plurality of optoelectronic devices in the photovoltaic device array correspond to each other, and each TFT in the TFT array is electrically connected to a corresponding photovoltaic device; and
in any adjacent two TFTs in the TFT array, a virtual line connecting a center of a source electrode and a center of a drain electrode of a first TFT do not coincide with a virtual line connecting a center of a source electrode and a center of a drain electrode of a second TFT.

10. The display apparatus according to claim 9, wherein the plurality of TFTs in the TFT array are arranged in rows and columns, and the virtual lines of any row of TFTs in the TFT array are parallel to each other.

11. The display apparatus according to claim 10, wherein the virtual lines of any row of TFTs in the TFT array is at a preset angle from an arrangement direction of any column of TFTs in the TFT array, the preset angle being greater than 0 degree and smaller than 90 degrees.

12. The display apparatus according to claim 11, wherein the preset angle is 45 degrees.

13. The display apparatus according to claim 10, wherein the virtual lines of two TFTs spaced by one TFT among the any row of TFTs in the TFT array coincide with each other.

14. The display apparatus according to claim 9, wherein any one of the photovoltaic devices comprises two electrodes and a photoelectric material provided between the two electrodes.

15. The display apparatus according to claim 9, wherein any one of the TFTs is a multi-gate TFT.

16. The display apparatus according to claim 9, wherein the fingerprint identification component further comprises a lens array,
wherein the lens array is provided on the photovoltaic device array and configured to change a direction of a light ray directed toward the photovoltaic device array.

17. The display apparatus according to claim 9, wherein the TFT array and the photovoltaic device array are provided in the display panel.

18. The display apparatus according to claim 17, wherein the display panel comprises a color film substrate, a liquid crystal layer and an array substrate, the liquid crystal layer being provided between the color film substrate and the array substrate, and the TFT array and the optoelectronic device array are provided on the array substrate.

19. The display apparatus of claim 18, wherein the fingerprint identification component further comprises a lens array, and the lens array is provided on the color film substrate.

20. The display apparatus according to claim 9, wherein the display panel is an organic light-emitting diode OLED display panel.

\* \* \* \* \*